United States Patent
Fan

(10) Patent No.: US 7,569,935 B1
(45) Date of Patent: Aug. 4, 2009

(54) PILLAR-TO-PILLAR FLIP-CHIP ASSEMBLY

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/269,577

(22) Filed: Nov. 12, 2008

(51) Int. Cl.
  *H01L 29/40* (2006.01)
(52) U.S. Cl. ............... 257/737; 257/778; 257/E23.021
(58) Field of Classification Search ............... 257/678, 257/778, 693, 697, 737, 738
  See application file for complete search history.

(56) References Cited

U.S. PATENT DOCUMENTS

| | | | |
|---|---|---|---|
| 5,790,377 A * | 8/1998 | Schreiber et al. ............ 361/704 |
| 6,229,220 B1 | 5/2001 | Saitoh et al. | |
| 6,578,754 B1 * | 6/2003 | Tung .................... 228/180.22 |
| 6,800,169 B2 * | 10/2004 | Liu et al. .................... 156/292 |
| 7,382,049 B2 * | 6/2008 | Ho et al. .................... 257/737 |

\* cited by examiner

*Primary Examiner*—Roy K Potter
(74) *Attorney, Agent, or Firm*—Muncy, Geissler, Olds & Lowe, PLLC

(57) ABSTRACT

A pillar-to-pillar flip-chip assembly primarily comprises a substrate, a chip disposed on the substrate, a plurality of first copper pillars on the bonding pads of the chip, a plurality of second copper pillars on the bump pads of the substrate, and a soldering material. A first height of the first copper pillars protruding from the active surface of the chip is the same as a second height of the second copper pillars from the solder mask on the substrate. When the soldering material electrically and mechanically connects the first copper pillars to the second copper pillars, a plurality of central points of the soldering material are formed on an equal-dividing plane between the chip and the substrate to reduce the direct stresses exerted at the soldering material to avoid peeling or breaks from the bump pads. Moreover, each of conventional solder balls is replaced with two soldered copper pillars to meet the lead-free requirements with higher reliability and lower costs.

16 Claims, 7 Drawing Sheets

PILLAR-TO-PILLAR FLIP-CHIP ASSEMBLY

FIELD OF THE INVENTION

The present invention relates to a semiconductor device, and more particularly to a pillar-to-pillar flip-chip assembly.

BACKGROUND OF THE INVENTION

Flip-chip technology is to dispose a plurality of conductive bumps or extruded electrical terminals on the bonding pads formed on the active surface of a chip, and then to flip the bumped chip onto a substrate to complete electrical connections. Comparing to the electrical connections by wire bonding, the flip chip technology provides shorter electrical connections between a chip and a substrate to enhance and achieve a higher signal transmission rate with a better signal quality for high-speed IC chips. Therefore, flip-chip technology becomes the trend for advanced semiconductor packages to provide higher operation speeds and better electrical performance. However, the flip-chip bonding between a chip and a substrate is point-to-point electrical connection. Once external stresses are encountered, the bumps will easily be broken leading to electrical connection failure between a chip and a substrate.

There are two kinds of bumps available in the market now, tin-lead solder bumps and gold bumps. However, tin-lead solder bumps can not meet the regulations of RoHS of Europe for environmental issues and the cost of gold bumps is not only high but also getting higher and higher in the recent years. Moreover, there are reliability issues if lead-free solder bumps directly replace the tin-lead solder bumps. Normally, tin-lead solder bumps need to go through reflowing processes to form tin-lead solder balls. However, during high-temperature reflowing processes, tin-lead solder bumps are melted to form solder balls leading to electrical short caused by bridging between adjacent solder balls for fine-pitch with small-spacing applications, moreover, an appropriate flip-chip gap between a bumped chip and a substrate cannot be maintained by solder balls for normal underfilling processes. On the other hand, gold bumps are jointed by high-temperature thermal compression. However, during high-temperature thermal compression processes, gold bumps will easily be crashed and deformed and an appropriate flip-chip gap between a bumped chip and a substrate cannot be maintained for normal underfilling processes in fine-pitch applications, either. Moreover, high-temperature processes will impact the functions of IC chips. Therefore, for the existing flip-chip technology either tin-lead solder bumps or gold bumps, the flip-chip gap between a bumped chip and a substrate can not effectively be controlled where the flip-chip gap will easily change due to variation of processing parameters such as temperatures or pressures causing poor underfilling qualities such as voids leading to reliability issues.

As disclosed in U.S. Pat. No. 6,229,220 by IBM, a conventional flip-chip assembly is revealed to control and maintain a uniform flip-chip gap between a bumped chip and a substrate. The cross-sectional view of the flip-chip assembly before flip-chip bonding is as shown in FIG. 1. The flip-chip assembly primarily comprises a substrate 110, a chip 120, and a plurality of copper pillars 130 on the chip 120. The substrate 110 serves as a chip carrier having a top surface 111 and a corresponding bottom surface 112 where a plurality of bump pads 114 are formed on the top surface 111. The chip 120 has a plurality of bonding pads 112 formed on the active surface 121 and is flip-chip bonded on the top surface 111 of the substrate 110 where the copper pillars 130 are disposed on the bonding pads 122 to control the flip-chip gap. A soldering material 150 is disposed on the top of each copper pillar 130. The copper pillars 130 on the chip 120 are electrically connected to the bump pads 114 and then to the internal conductive traces of the substrate 110 to an external electronic device, not shown in the figure.

As shown in FIG. 2, the soldering material 150 after reflowing processes joints the copper pillars 130 to the bump pads 114 where the heights of the copper pillars 130 are higher than the ones of the bump pads 114 and the bump pads 114 are directly exposed from the top surface 111 of the substrate 110 so that the central points 151 of the soldering material 150 cannot be disposed on an equal-dividing plane P located at the middle of the flip-chip gap H1 between the chip 120 and the substrate 110 so that the soldering material 150 is closer to the substrate 110.

As shown in FIG. 3, when the substrate 110 of the conventional flip-chip assembly mentioned above experiences warpage due to temperature differences, more thermal stresses will exert on the bump pads 114 than on the copper pillar 130 causing peeling or breaks at the solder-joint interfaces leading to electrical failure and the reliability of the flip-chip assembly is impacted. Especially, when a solder mask covers the top surface 111 of the substrate 110 to make the bump pads 114 embedded, the issues of peeling or breaks becomes serious.

SUMMARY OF THE INVENTION

The main purpose of the present invention is to provide a pillar-to-pillar flip-chip assembly to reduce the thermal stresses exerted on the interfaces between the soldering material and the bump pads of a substrate caused by warpage due to CTE mismatching between a chip and a substrate to avoid peeling or breaks of solder joints.

According to the present invention, a pillar-to-pillar flip-chip assembly is revealed, primarily comprising a substrate, a chip, a plurality of first copper pillars, and a plurality of second copper pillars, and a soldering material. The substrate has a top surface and a corresponding bottom surface where a solder mask and a plurality of bump pads are disposed on the top surface with the bump pads exposed from the solder mask. The chip is disposed on the top surface of the substrate where a plurality of bonding pads are disposed on the active surface of the chip. The first copper pillars are disposed on the bonding pads and the second copper pillars on the bump pads. The soldering material joints the first copper pillars and the second copper pillars where the height of the first copper pillars are about the same as the one of the second copper pillars so that a plurality of central points of the soldering material between the first copper pillars and the corresponding second copper pillars are formed on an equal-dividing plane between the chip and the substrate.

The pillar-to-pillar flip-chip assembly according to the present invention has the following advantages and functions:

1. By disposing a plurality of second copper pillars on the substrate with about a same height as the first copper pillars, the central points of the soldering material at the solder points are formed on the equal-dividing plane dividing the flip-chip gap between the chip and the substrate to reduce thermal stresses directly exerted on the interfaces between the soldering material and the bump pads of a substrate caused by warpage due to CTE mismatching between the chip and the substrate to avoid peeling and breaks of solder joints. Furthermore, the solder balls can be replaced to meet the lead-free requirements and to manufacture high reliability flip-chip assemblies with low manufacturing costs.

2. By increasing the heights of the second copper pillars on the substrate, the flip-chip gap between the chip and the substrate is enlarged until the height of the second copper pillars protruding from the solder mask is not less than the one of the first copper pillars on the chip to increase the maximum endurable stresses exerted at the central points of the solder joints to enhance the encapsulating or underfilling processes.

3. By proper designing the dimensions of the solder mask openings, the bump pads are partially exposed from the solder mask without covering by the second copper pillars so that excess soldering materials can be accommodated on the sidewalls of the second copper pillars and the exposed areas of the bump pads to avoid the formation of free solder beads or particles.

4. By proper designing a plurality sidewalls of the second copper pillars facing to a plurality corners of the bump pads, the soldering areas on the bump pads can be increased to accommodate more of the excess soldering materials and stress can be released.

5. By the flat-top design of the second copper pillars, the soldering materials can be concentrated at the equal-dividing plane between the chip and the substrate to avoid the spreading contaminations of the soldering materials on the bump pads of the substrate.

DETAILED DESCRIPTION OF THE INVENTION

Please refer to the attached drawings, the present invention is described by means of embodiment(s) below.

Figure 1:
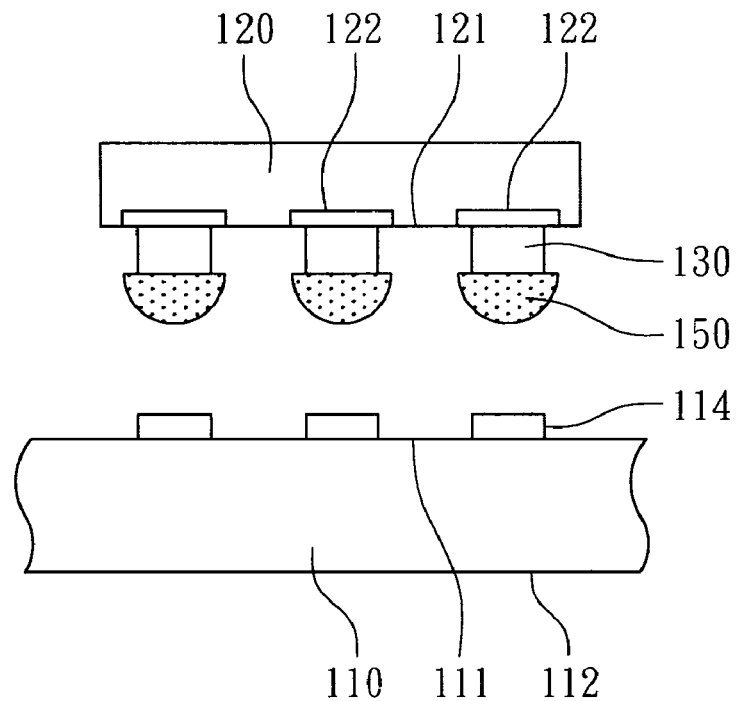
FIG. 1 is a cross-sectional view of a conventional flip-chip assembly before flip-chip bonding.
Figure 2:
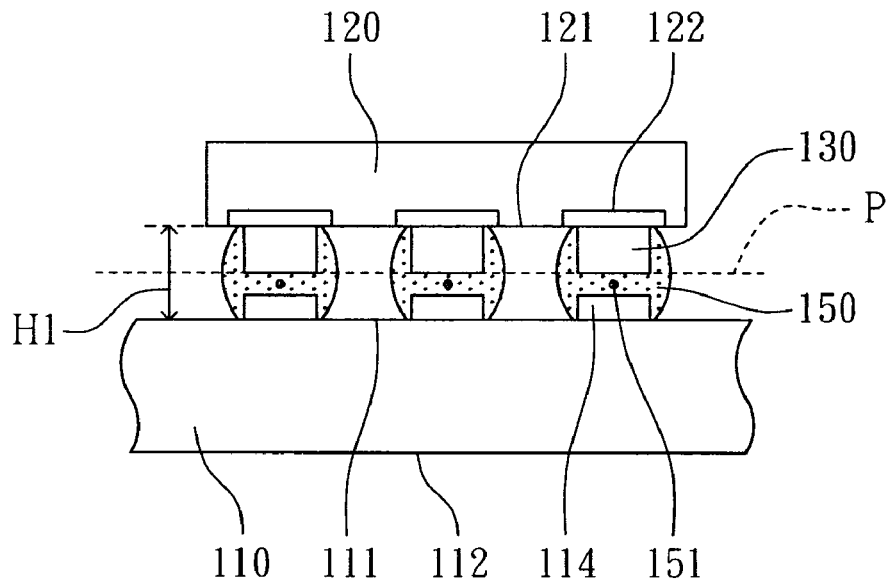
FIG. 2 is a cross-sectional view of a conventional flip-chip assembly after flip-chip bonding.
Figure 3:
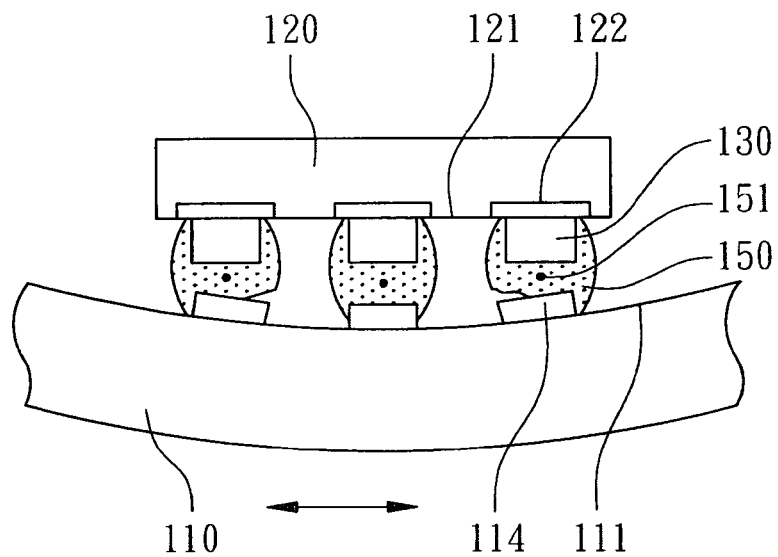
FIG. 3 is a cross-sectional view of a flip-chip assembly after substrate warpage.
Figure 4:
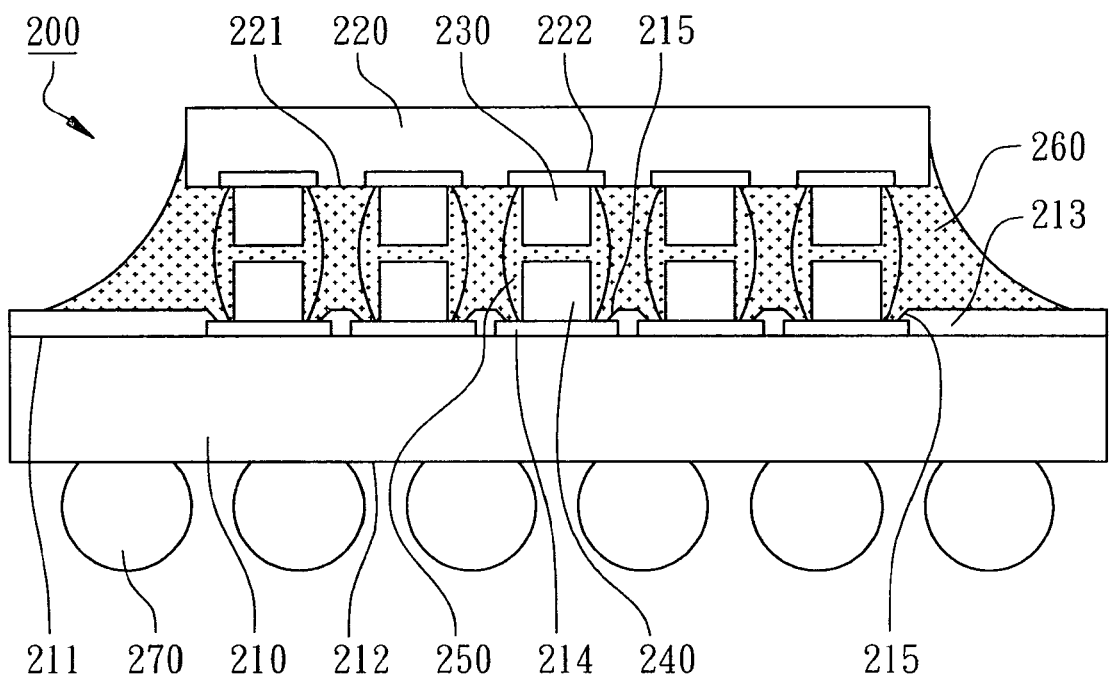
FIG. 4 is a cross-sectional view of a pillar-to-pillar flip-chip assembly according to the first embodiment of the present invention.

According to the preferred embodiment of the present invention, a pillar-to-pillar flip-chip assembly is illustrated in FIG. 4 for a cross-sectional view.

The pillar-to-pillar flip-chip assembly 200 primarily comprises a substrate 210, a chip 220, a plurality of first copper pillars 230, a plurality of second copper pillars 240, and a soldering material 250.

The substrate 210 has a top surface 211 and a corresponding bottom surface 212 which is a high-density, double-sided, multi-layer printed circuit board with internal conductive traces and vias manufactured. The substrate 210 can be one of the array units of a substrate strip and after package saw to become the substrate 210 described in the present embodiment. A solder mask 213 is formed on the top surface 211. A plurality of bump pads 214 are disposed on the top surface 211 with the bump pads 214 exposed from the solder mask 213 but embedded in the solder mask 213. The solder mask 214 is also known as "solder resist" made of epoxy resins or photo-sensitive resins printed on the surfaces of a printed circuit board to form a dielectric layer on the substrate 210 to protect the conductive traces from moisture and external contaminations. The solder mask 213 can be disposed by screen printing, curtain printing, spray printing, roller printing, etc. To be more specific, the solder mask 213 has a plurality of solder mask openings 215 to expose the bump pads 214.

Figure 6:
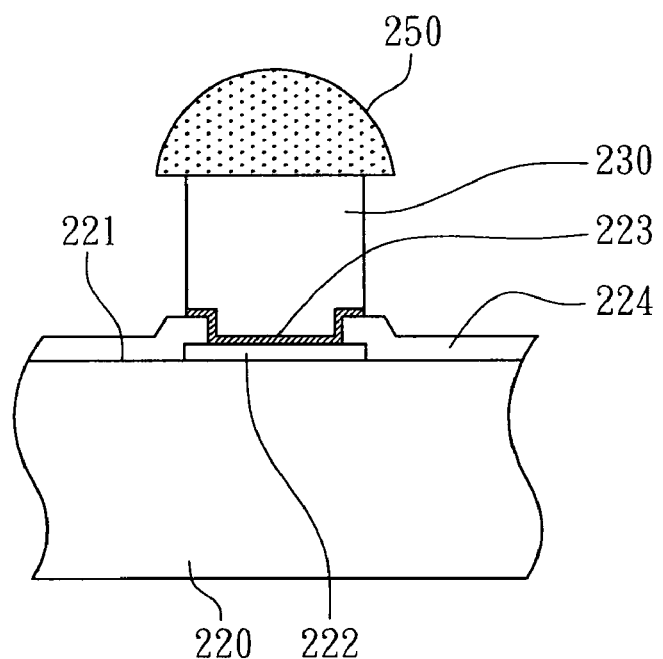
FIG. 6 is a partially enlarged cross-sectional view of the pillar-to-pillar flip-chip assembly to show a first copper pillar disposed on a chip according to the first embodiment of the present invention.

As shown in FIG. 4, the chip 220 is disposed on the top surface 221 of the substrate 210 with a plurality of bonding pads 222 disposed on the active surface 221 of the chip 220 where the bonding pads 222 serve as the signal I/O for the chip 220. The chip 220 is a semiconductor IC chip which is made of semiconductor materials with signal patterns disposed on the active surface 221 such as micro controllers, micro processors, memories, logic chips, ASIC, or combinations of some of them. To be more specific, as shown in FIG. 6, the chip 220 has a plurality of Under Bump Metallurgy layers (UBM layers) 223 formed between the first copper pillars 230 and the bonding pads 222 where the UBM layers 223 are formed by sputter with a three-metal-layer structure, not shown in the figure, including an adhesion layer, a wetting layer, and an anti-oxidation layer to enhance the bonding strengths between the first copper pillars 230 and the bonding pads 222. A passivation layer 224 is disposed on the active surface 221 of the chip 220 to fully cover the active surface 221 with the bonding pads 222 exposed to protect the IC components on the active surface 221 and to planarize the active surface 221. The UBM layers 223 are disposed on the bonding pads 222 and covered parts of the peripheries of the openings of the passivation layer 224.

Figure 5:
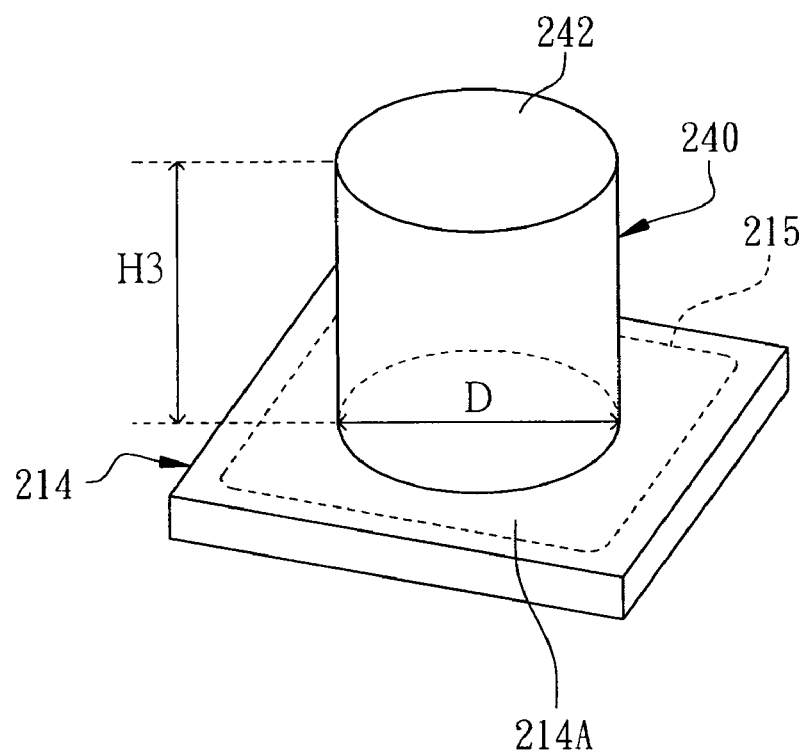
FIG. 5 is a partially enlarged three-dimensional view of the pillar-to-pillar flip-chip assembly to show a second copper pillar disposed on a bump pad according to the first embodiment of the present invention.

As shown in FIG. 4, the first copper pillars 230 are disposed on the bonding pads 222 and the second copper pillars 240 on the bump pads 214 where the copper pillars 230 and 240 are made of pure copper, copper alloy, or rigid conductive pillars with hardness greater than the one of gold. Preferably, the second copper pillars 240 have a plurality of flat tops 242 as shown in FIG. 5 for soldering and keeping most of the soldering material 250 away from the bump pads 214. The first copper pillars 230 are of a first height protruding from the active surface 221. The second copper pillars 240 are of a same height (the second height H3 as shown in FIG. 5). The second height H3 of the second copper pillars 240 protruding from the solder mask 213 is not less than the length or the diameter D of the footprints of the second copper pillars 240 disposed on the corresponding bump pads 214. In the present embodiment, as shown in FIG. 5, the diameter or length of the solder mask openings 215 of the solder mask 213 is smaller than the one of the bump pads 214 but greater than the one of the footprint of the second copper pillars 240. For example, the solder mask opening 215 may be rectangular and the second copper pillars 240 may be cylindrical where the length of the shorter sides of the solder mask openings 215 are greater than the diameters D of the footprints of the second copper pillars 240. Accordingly, as shown in FIG. 5, the solder mask openings 215 have dimensions in a manner that the bump pads 214 have a plurality of exposed areas 214A defined by the solder mask openings 215 and the second copper pillars 240. Therefore, in a better configuration, the second copper pillars 240 are not in direct contact with the solder mask 213 to reduce the stress exerted on the second copper pillars 240 due to the solder mask 213. Since the exposed area 214A on each bump pad 214 is not covered by the corresponding second copper pillar 240 nor by the solder mask 213, the exposed areas 214A can accommodate and keep excess soldering material 250 on the sidewalls of the second copper pillars 240 to avoid the formation of free solder beads.

Figure 7:
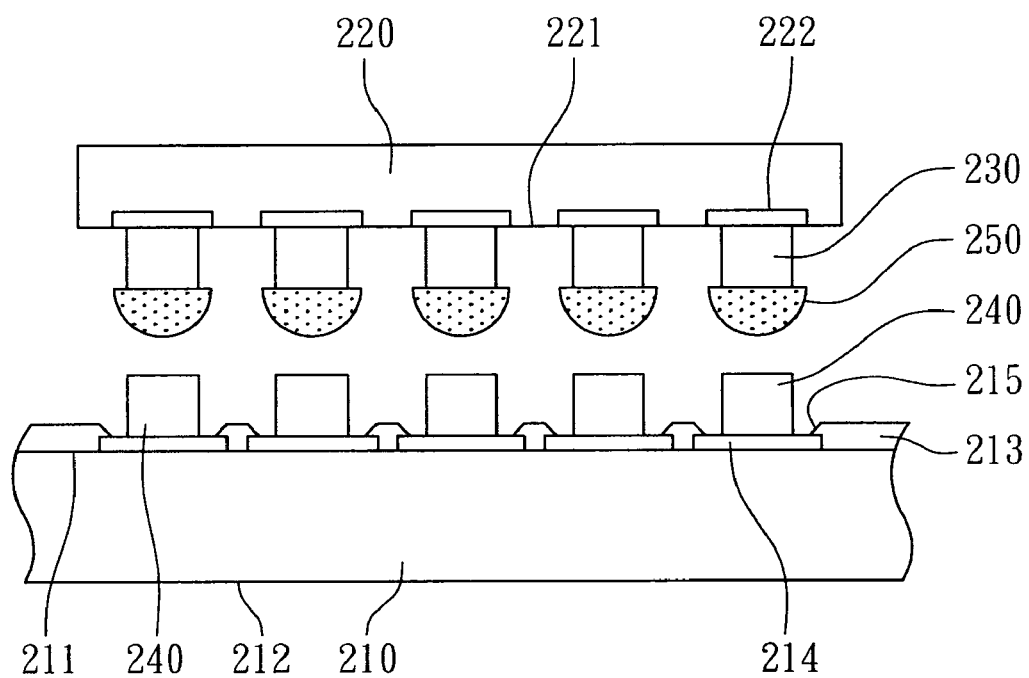
FIG. 7 is a partial cross-sectional view of a pillar-to-pillar flip-chip assembly before flip-chip bonding according to the first embodiment of the present invention.
Figure 8:
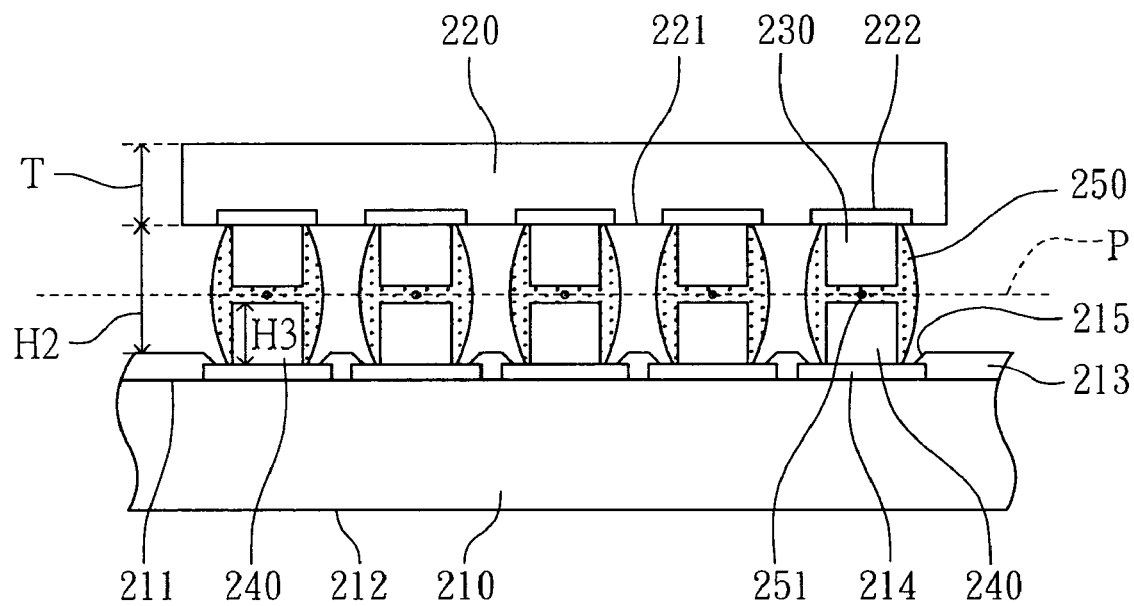
FIG. 8 is a partial cross-sectional view of a pillar-to-pillar flip-chip assembly after flip-chip bonding according to the first embodiment of the present invention.

Therefore, extruded copper pillars are disposed on the chip 220 as well as on the substrate 210. The first copper pillars 230 and the second copper pillars 240 are electrically and mechanically jointed by the soldering materials 250. In a more detail description, as shown in FIG. 6 and FIG. 7, the soldering materials 250 are pre-disposed on top of the first copper pillar 230. After flip-chip bonding and reflowing processes, the soldering materials 250 are melted and formed electrical and mechanical connections between the first copper pillars 230 and the second copper pillars 240, as shown in FIG. 8. Normally the soldering material 250 prefers lead-free solder such as Sn(96.5%)-Ag(3%)-Cu(0.5%) where the reflowing temperature is above 217° C. and the wettability for soldering is available at the maximum temperature of 245° C. Moreover, the melting points of the first copper pillars 230 and the second copper pillar 240 should be higher than the reflowing temperature mentioned above to perform pillar-to-pillar stand-off functions.

Figure 9:
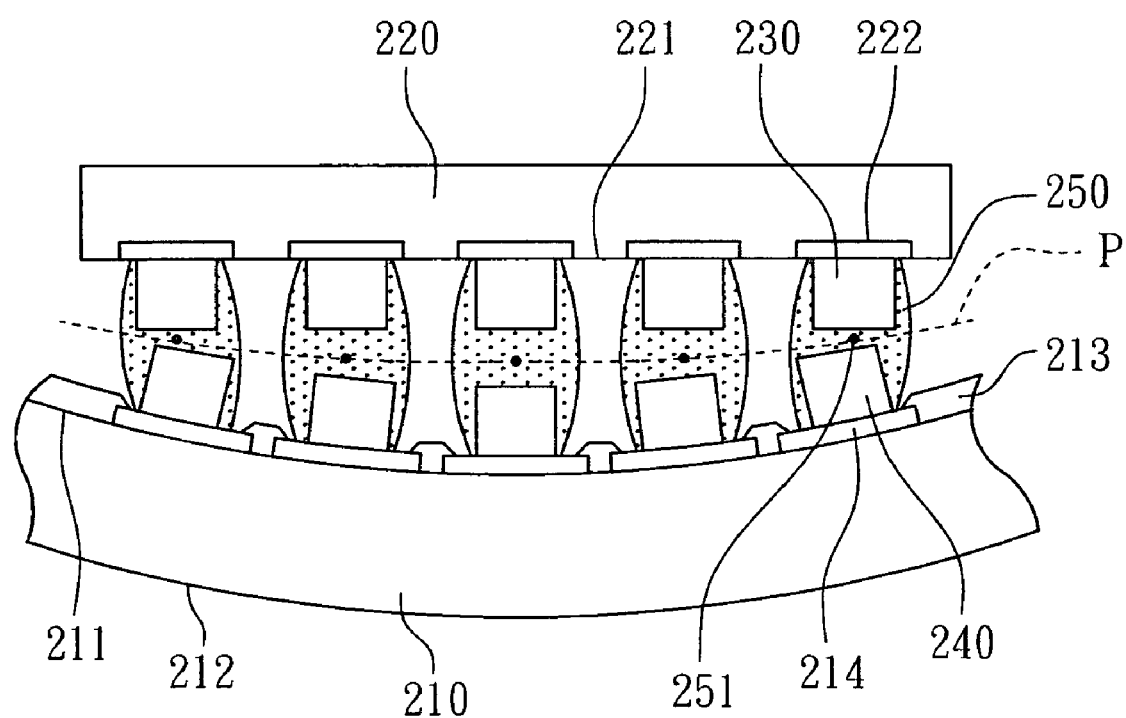
FIG. 9 is a partial cross-sectional view of a pillar-to-pillar flip-chip assembly after substrate warpage according to the first embodiment of the present invention.

Furthermore, as shown in FIG. 8, the first height of the first copper pillars 230 is about the same as the second height H3 of the second copper pillars to make a plurality of central solder points 251 of the soldering material 250 are formed on an equal-dividing plane P between the chip 220 and the substrate 210. The equal-dividing plane P is a plane located at the middle of the flip-chip gap H2 where the shortest distance from any point in the flip-chip gap H2 and on the equal-dividing plane P to the chip 220 and to the substrate 210 is the same. When there is a warpage difference between the substrate 210 and the chip 220 as shown in FIG. 9, the warpage of the equal-dividing plane P is equal to half of the warpage difference. Therefore, the locations of the first copper pillars 230 and the second copper pillars 240 are vertically corresponding to each other with a same height ranging from 30 μm to 90 μm (equal to the second height H3). Since the first copper pillars 230 and the second copper pillars 240 have higher rigidity and lower costs and will not collapse during flip-chip bonding, therefore, a uniform flip-chip gap H2 can be maintained when the chip 220 is flip-chip bonded to the substrate 210. Preferably, as shown in FIG. 8, the second height H3 of the second copper pillars 240 can not be less than half of the thickness T of the chip 220. The flip-chip gap H2 cannot be less than the thickness T of the chip 220 by increasing the height H3 of the second copper pillars 240 to enhance the maximum bearable stresses at the center points 251 of the solder joints of the soldering material 250 between the corresponding copper pillars 230 and 240.

As shown in FIG. 9, when the substrate 210 experiences thermal stresses due to CTE mismatching leading to substrate warpage, the central points 251 of the solder joints of the soldering material 250 will remain on the equal-dividing plane P to reduce the warpage differences between the substrate 210 and the chip 220 and to reduce the stresses directly exerted on the central points 251 of the solder joints due to temperature differences so that breaks of the soldering material 250 at the central points 251 of the solder joints can be avoided.

Therefore, the conventional solder balls, tin-lead bumps, or gold bumps are replaced by the combinations consisting of the first copper pillars 230, the second copper pillars 240, and the soldering material 250 where the first copper pillars 230 and the second copper pillars 240 have the same heights, therefore, the flip-chip gap can be well controlled and maintained to meet lead-free requirements with higher reliability and lower costs.

Figure 10A:
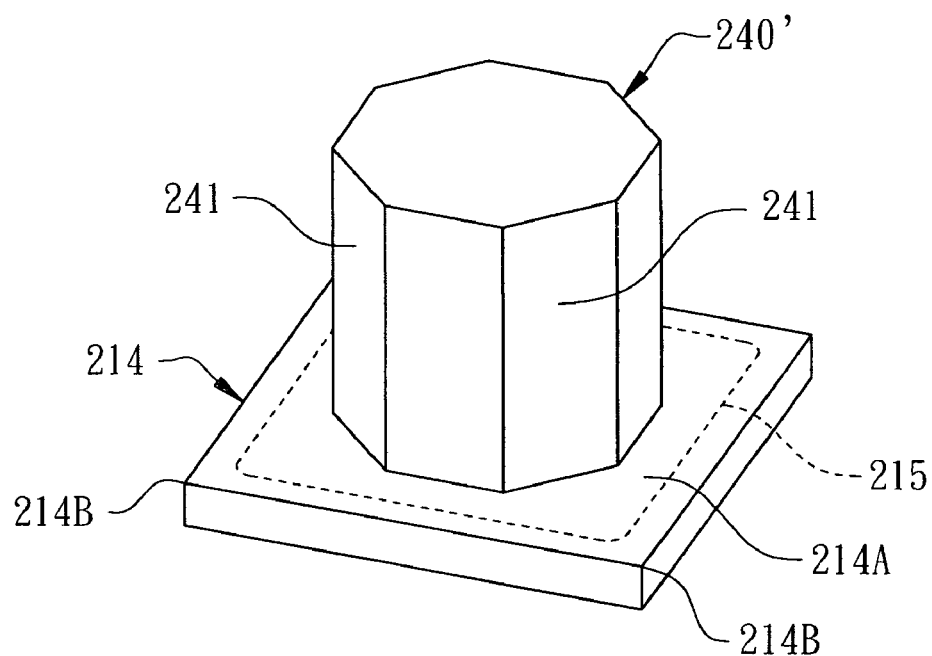
FIGS. 10A and 10B are an enlarged three-dimensional view and a top view of another design of a second copper pillar of a pillar-to-pillar flip-chip assembly according to the first embodiment of the present invention.
Figure 10B:
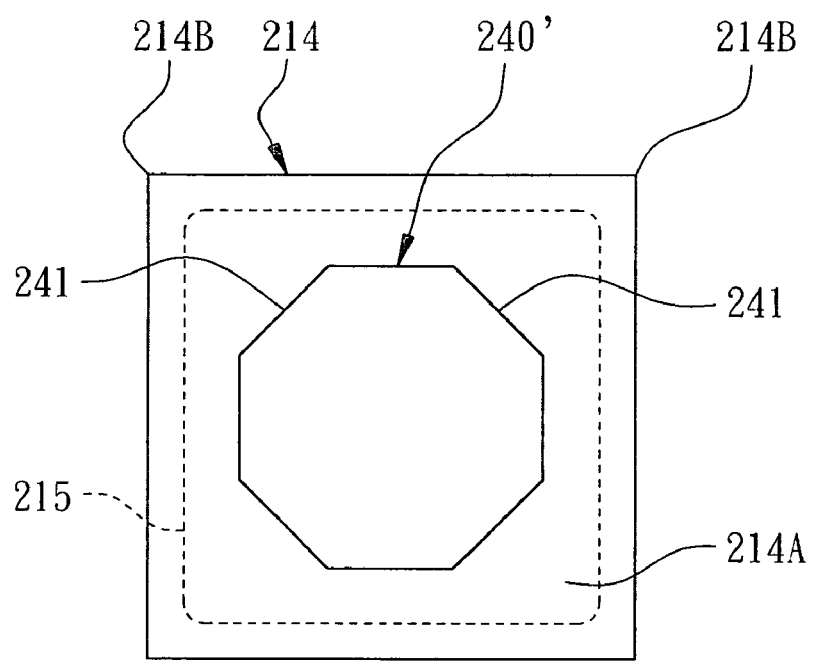

Furthermore, the first copper pillars 230 and the second copper pillars 240 are formed by plating. As shown in FIG. 4 again, the first copper pillars 230 and the second copper pillars 240 have the same dimensions with the same shapes. As shown in the present embodiment, the first copper pillars 230 and the second copper pillars 240 are cylindrical, as shown in FIG. 5, but without limitations, the copper pillars 230 and 240 can be any shapes of polyhedrons. As shown in FIG. 10A and FIG. 10B, the second copper pillars 240' can be octagonal cylinders with a plurality of sidewalls 241 facing a plurality of corners 214B of the bump pads 214 so that the bump pads 214 have the exposed area 214A to accommodate excess soldering materials 250. Since the sidewalls 241 of the second copper pillars 240' are designed to face the corners 214B of the bump pads 214, the corners or sharp edges formed between the sidewalls 241 of the second copper pillars 240' will not face the corners 214B of the bump pads 214. When external stresses exerted on the second copper pillars 240' will be distributed to the bump pads 214 without directly pulling or pushing the corners 214B of the bump pads 214 leading to peeling. As shown in FIG. 5, the first embodiment of the second copper pillars 240 are cylindrical where the sidewalls 241 of the second copper pillars 240 facing the bump pads 214 are arc surfaces having the similar functions to distribute the external stresses to avoid peeling of the bump pads 214 from the top surface 211.

As shown in FIG. 4 and FIG. 8, after flip-chip jointing the first copper pillars 230 and the second copper pillars 240 by the soldering material 250, an underfilling material 260 with high flowability is disposed into and completely fills in the flip-chip gap H2 between the chip 220 and the substrate 210 without any voids to distribute stress and further firmly joint the chip 220 and the substrate 210 and to protect the flip-chip gap H2 away from moisture and contaminations. The increase of the heights of the second copper pillars 240 disposed on the substrate 210 can control and enhance the filling speed to complete filling the underfilling material 260 in a shorter time without any voids.

Moreover, the pillar-to-pillar flip-chip assembly 200 further comprising a plurality of solder balls 270 disposed on the bottom surface 212 of the substrate 210 to enable the chip 220 of the pillar-to-pillar flip-chip assembly 200 to electrically connect to an external printed circuit board. The pillar-to-pillar flip-chip assembly 200 can be a flip-chip package with bare die or a BGA package. The pitch of the solder balls 270 is larger than the one of the second copper pillars 240.

Figure 11:
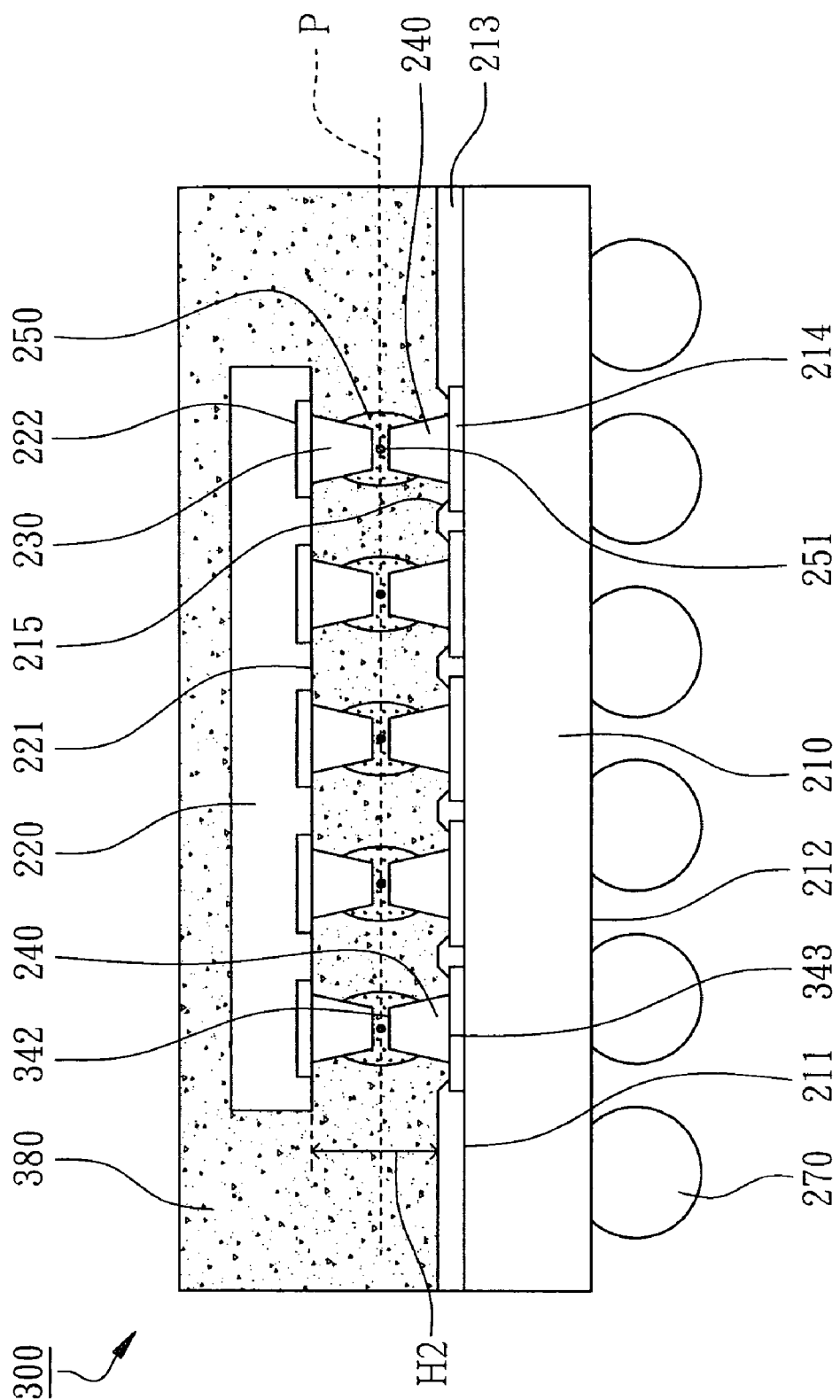
FIG. 11 is a cross-sectional view of another pillar-to-pillar flip-chip assembly according to the second embodiment of the present invention.

According to the second embodiment of the present invention, another pillar-to-pillar flip-chip assembly 300 is revealed in FIG. 11 for a cross-sectional view. The pillar-to-pillar flip-chip assembly 300 primarily comprises a substrate 210, a chip 220, a plurality of first copper pillars 230, a plurality of second copper pillars 240, and a soldering material 250 where the major components are the same as the ones described in the first embodiment with the same component numbers which can achieve the same advantages and functions. No detail description will be followed.

In the present embodiment, the second copper pillars 240 are flat-head polyhedrons such as flat-head cone. Each second copper pillar 240 has a flat top 342 and a bottom surface 343 where the area of the flat top 342 is less than the one of the bottom surface 343 so that the soldering material 250 will be concentrated toward the equal-dividing plane P between the chip 220 and the substrate 210 to avoid spreading contaminations of the soldering material 250 on the bump pads 214 of the substrate 210. Therefore, the soldering material 250 will be concentrated at the equal-dividing plane P by the flat-head design of the first copper pillars 230 and the second copper pillars 240, therefore, the amount of soldering material 250 can be well controlled without contaminating the bump pads 214 of the substrate 210.

Furthermore, the pillar-to-pillar flip-chip assembly 300 further comprises an encapsulant 380 such as EMC (epoxy molding compound) to completely fill in the flip-chip gap H2 between the chip 220 and the substrate 210 and to encapsulate the chip 220, the first copper pillars 230, the second copper pillars 240 and the soldering material Since the flip-chip gap H2 between the chip 220 and the substrate 210 are larger and more stable than the one of the conventional flip-chip assembly, the maximum bearable stresses exerted at the central points 251 of the solder joint between the copper pillars can be enhanced to facilitate the no-void filling of the encapsulant 380 by transfer molding.

The above description of embodiments of this invention is intended to be illustrative but not limiting. Other embodiments of this invention will be obvious to those skilled in the art in view of the above disclosure.

What is claimed is:

1. A pillar-to-pillar flip-chip assembly primarily comprising:
   a substrate having a top surface, a corresponding bottom surface, a solder mask on the top surface and a plurality of bump pads on the top surface exposed from the solder mask;
   a chip disposed on the top surface of the substrate, the chip having a plurality of bonding pads disposed on an active surface;
   a plurality of first copper pillars disposed on the bonding pads;
   a plurality of second copper pillars disposed on the bump pads; and
   a soldering material electrically and mechanically connecting the first copper pillars and the second copper pillars, wherein a first height of the first copper pillars protruding from the active surface is the same as a second height of the second copper pillars from the solder mask so that the soldering material has a plurality of central points formed on an equal-dividing plane between the chip and the substrate.

2. The pillar-to-pillar flip-chip assembly as claimed in claim 1, wherein the second height of the second copper pillars is not less than half of the thickness of the chip.

3. The pillar-to-pillar flip-chip assembly as claimed in claim 1, wherein the second copper pillars have a plurality of flat tops.

4. The pillar-to-pillar flip-chip assembly as claimed in claim 1, wherein the second height of the second copper pillars is not less than a length or diameter of the footprints of the second copper pillars on the corresponding bump pads.

5. The pillar-to-pillar flip-chip assembly as claimed in claim 1, wherein the second copper pillars are not in direct contact with the solder mask.

6. The pillar-to-pillar flip-chip assembly as claimed in claim 1, wherein the chip has a plurality of UBM layers formed between the first copper pillars and the bonding pads.

7. The pillar-to-pillar flip-chip assembly as claimed in claim 1, further comprising an underfilling material completely filling in the gap between the chip and the substrate.

8. The pillar-to-pillar flip-chip assembly as claimed in claim 1, further comprising an encapsulant filling in the gap between the chip and the substrate and encapsulating the chip, the first copper pillars, the second copper pillars and the soldering material.

9. The pillar-to-pillar flip-chip assembly as claimed in claim 1, wherein the substrate is a printed circuit board and the chip is a semiconductor IC chip.

10. The pillar-to-pillar flip-chip assembly as claimed in claim 1, wherein the solder mask has a plurality of solder mask openings, wherein the solder mask openings have a dimension in a manner that the bump pads have a plurality of exposed areas defined by the solder mask openings and the second copper pillars.

11. The pillar-to-pillar flip-chip assembly as claimed in claim 3, wherein the second copper pillars are cylinders.

12. The pillar-to-pillar flip-chip assembly as claimed in claim 3, wherein the second copper pillars are polyhedrons.

13. The pillar-to-pillar flip-chip assembly as claimed in claim 12, wherein each second copper pillar has a plurality of sidewalls facing a plurality of corners of the corresponding bump pads.

14. The pillar-to-pillar flip-chip assembly as claimed in claim 1, wherein the soldering material is lead-free solder.

15. The pillar-to-pillar flip-chip assembly as claimed in claim 1, further comprising a plurality of solder balls disposed on the bottom surface of the substrate.

16. The pillar-to-pillar flip-chip assembly as claimed in claim 15, wherein the pitch of the solder balls is larger than the one of the second copper pillars.

* * * * *